(12) United States Patent
Dernovsek et al.

(10) Patent No.: US 9,734,948 B2
(45) Date of Patent: Aug. 15, 2017

(54) ELECTRONIC COMPONENT AND METHOD FOR THE PASSIVATION THEREOF

(71) Applicant: EPCOS AG, Munich (DE)

(72) Inventors: Oliver Dernovsek, Lieboch (AT); Michael Stahl, Pölfing Brunn (AT)

(73) Assignee: EPCOS AG, Munich (DE)

( * ) Notice: Subject to any disclaimer, the term of this patent is extended or adjusted under 35 U.S.C. 154(b) by 51 days.

(21) Appl. No.: 14/785,753

(22) PCT Filed: Apr. 4, 2014

(86) PCT No.: PCT/EP2014/056832
§ 371 (c)(1),
(2) Date: Oct. 20, 2015

(87) PCT Pub. No.: WO2014/180608
PCT Pub. Date: Nov. 13, 2014

(65) Prior Publication Data
US 2016/0071648 A1    Mar. 10, 2016

(30) Foreign Application Priority Data

May 6, 2013  (DE) ........................ 10 2013 104 621

(51) Int. Cl.
| | |
|---|---|
| *H01G 4/12* | (2006.01) |
| *H01G 4/30* | (2006.01) |
| *H01L 21/50* | (2006.01) |
| *H01L 41/053* | (2006.01) |
| *H01L 41/23* | (2013.01) |
| *H01C 7/102* | (2006.01) |

(Continued)

(52) U.S. Cl.
CPC ............. *H01G 4/12* (2013.01); *C04B 41/009* (2013.01); *C04B 41/45* (2013.01); *C04B 41/81* (2013.01); *C25D 3/56* (2013.01); *H01C 1/14* (2013.01); *H01C 7/10* (2013.01); *H01C 7/102* (2013.01); *H01G 4/005* (2013.01); *H01G 4/06* (2013.01); *H01G 4/22* (2013.01); *H01G 4/248* (2013.01); *H01G 4/30* (2013.01); *H01L 21/50* (2013.01); *H01L 41/0533* (2013.01); *H01L 41/083* (2013.01); *H01L 41/23* (2013.01)

(58) Field of Classification Search
CPC  H01G 4/12; H01G 4/005; H01G 4/06; H01G 4/22; H01G 4/248; H01G 4/30; C04B 41/009; C04B 41/45; C04B 41/81; C25D 3/56; H01C 1/14; H01C 7/10; H01C 7/102

See application file for complete search history.

(56) References Cited

U.S. PATENT DOCUMENTS 4,963,396 A    10/1990  Ito et al.
5,346,722 A     9/1994  Beauseigneur et al.
(Continued)

FOREIGN PATENT DOCUMENTS

DE    29904858 U1    7/1999
JP    H0710650 A     1/1995
(Continued)

*Primary Examiner* — Dion R Ferguson
(74) *Attorney, Agent, or Firm* — Slater Matsil, LLP

(57) ABSTRACT

An electronic component has a main body. The main body includes a porous material having surface pores at a surface of the main body. A passivation liquid is arranged in the surface pores. A method of forming an electronic component is also disclosed as is a method of passivating a body.

21 Claims, 1 Drawing Sheet

(51) Int. Cl.

| | |
|---|---|
| *H01G 4/06* | (2006.01) |
| *H01G 4/22* | (2006.01) |
| *H01L 41/083* | (2006.01) |
| *C04B 41/00* | (2006.01) |
| *C04B 41/45* | (2006.01) |
| *C04B 41/81* | (2006.01) |
| *C25D 3/56* | (2006.01) |
| *H01C 1/14* | (2006.01) |
| *H01C 7/10* | (2006.01) |
| *H01G 4/005* | (2006.01) |
| *H01G 4/248* | (2006.01) |

(56) References Cited

U.S. PATENT DOCUMENTS

| | | | |
|---|---|---|---|
| 6,980,413 B1* | 12/2005 | Kim | H01G 4/012 |
| | | | 29/25.42 |
| 2002/0028520 A1* | 3/2002 | Boschetti | C04B 38/009 |
| | | | 436/518 |
| 2004/0132900 A1* | 7/2004 | Sachdev | C03C 17/32 |
| | | | 524/606 |
| 2010/0020465 A1 | 1/2010 | Fukudome | |
| 2011/0273056 A1 | 11/2011 | Mizuno et al. | |
| 2012/0161576 A1 | 6/2012 | Motoki et al. | |
| 2012/0245016 A1 | 9/2012 | Curry et al. | |

FOREIGN PATENT DOCUMENTS

| | | |
|---|---|---|
| JP | H10265277 A | 10/1998 |
| JP | 2001131756 A | 5/2001 |
| JP | 200551195 A | 2/2005 |
| JP | 2009049361 A | 3/2009 |

\* cited by examiner

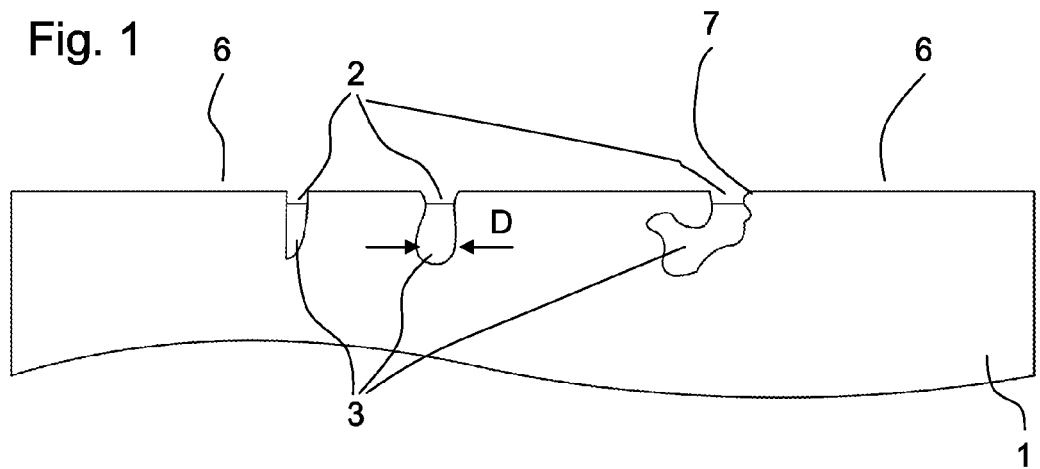
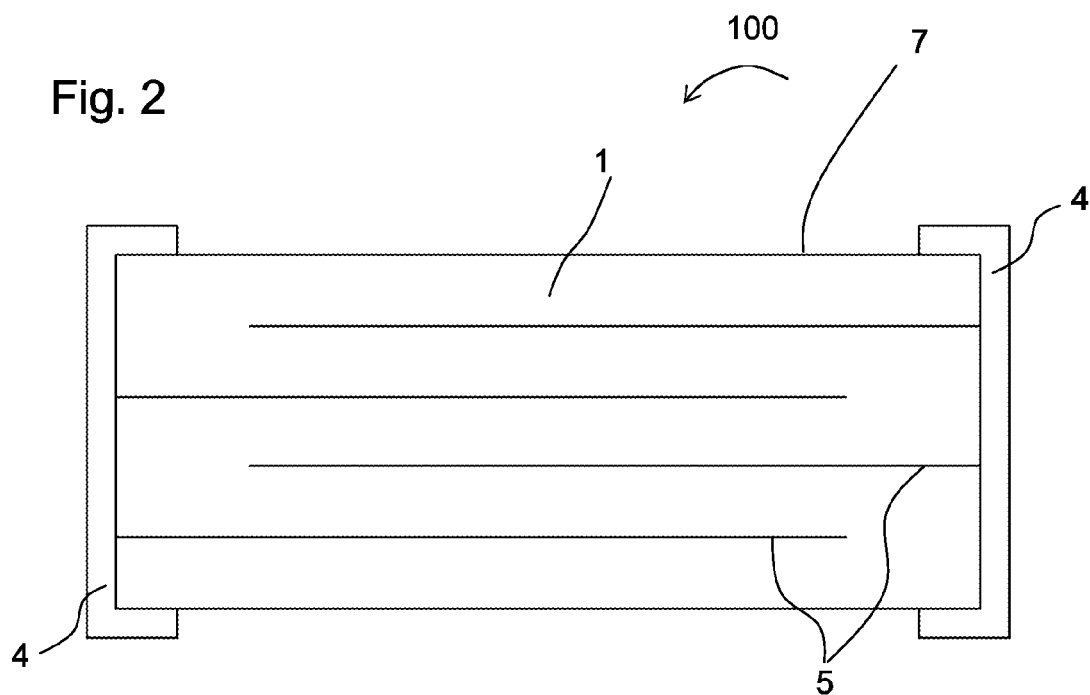

ELECTRONIC COMPONENT AND METHOD FOR THE PASSIVATION THEREOF

This patent application is a national phase filing under section 371 of PCT/EP2014/056832, filed Apr. 4, 2014, which claims the priority of German patent application 10 2013 104 621.5, filed May 6, 2013, each of which is incorporated herein by reference in its entirety.

TECHNICAL FIELD

The present invention relates to an electronic component, and to a method for passivating the electronic component.

SUMMARY

Embodiments of the invention specify an improved electronic component and a method for the passivation thereof.

An electronic component proposed comprises a main body, which comprises a porous material having surface pores at a surface of the main body. A passivation liquid is arranged in the surface pores.

In one preferred configuration, the surface of the main body is passivated with the passivation liquid. The surface is preferably an outer or envelope surface of the main body. The passivation liquid is preferably arranged permanently in the surface pores of the main body.

The passivation liquid is preferably not corrosive.

The surface pores are preferably sintering pores which arise in the course of a sintering process of the material forming the main body. The diameters of the surface pores can be in the nanometer range, for example.

The surface pores are preferably constituted and the vapor pressure of the passivation liquid is preferably chosen such that the passivation liquid cannot be removed from the pores or evaporate as a result of simple washing and/or drying processes.

In the present case, "passivation" preferably means the spontaneous or targeted production of a passivation layer or protective layer at the surface of the main body and/or in the surface pores. The passivation layer or protective layer preferably protects the surface pores and/or the main body against penetration of media or substances that are corrosive or damaging to the main body into the surface pores and/or into the interior of the main body.

In one preferred configuration, the presence of the passivation liquid in the surface pores slows down or prevents the reaction kinetics of electromechanical reactions and/or the arising of microcracks in the main body.

The presence of the passivation liquid in the surface pores can advantageously preclude or prevent or slow down corrosion of the material of the main body. Preferably, the passivation liquid can be used to prevent or restrict corrosive or electromechanical reactions and/or the arising of microcracks within the material of the main body, in particular with application or under the conditions of moisture, heat and/or electrical voltage. The microcracks and/or the electromechanical reactions can lead, for example, to a degradation of the electrical or electromechanical properties of the material of the main body and thus to a failure or an erroneous function of the electronic component. A failure or an erroneous function can have far reaching or catastrophic consequences, particularly in the case of safety-relevant applications and/or automotive applications of the electronic component.

With the passivation, the main body can be embodied in such a way that the density of statistical defects or cracks in the material of the main body is in the ppb range ("ppb" stands for "parts per billion") or less. The statistical defects can also be pores or pore-like defects in the interior of the main body.

In one preferred configuration, the main body comprises a ceramic. The ceramic is preferably a sintered ceramic.

In one preferred configuration, the electronic component is a multilayer component, for example, a varistor, a piezoelectric component or a capacitor.

In one preferred configuration, surface regions of the main body in which no pores are situated are free of the passivation liquid. In the surface regions of the main body, the passivation liquid may have been removed or evaporated as a result of washing and/or drying processes. The surface regions are, however, less susceptible toward corrosive media on account of their surface constitution, that is to say that the corrosive media can likewise be removed from the surface regions, for example, more easily by means of washing processes.

In one preferred configuration, the passivation liquid arranged in the surface pores prevents or makes more difficult the penetration of foreign substances, for example, corrosive substances, such as nickel- and/or tin-comprising electrolyte solutions, alkali-containing soldering fluxes, such as sodium or potassium hydroxide solutions and/or grinding protection media, into the main body via the pores. In accordance with this configuration, the electronic component can advantageously be produced by a method which requires the treatment of the electronic component or of starting components of the electronic component with the corrosive substances, without significant corrosion, degradation or damage of the electronic component or its starting components occurring.

The penetration or the infiltration of the corrosive substances into the surface pores can take place spontaneously via the gas phase or the liquid phase, without a passivation of the main body, for example, during the production of the electronic component.

In one preferred configuration, the passivation liquid is an inert solution or a quasi-inert solution, for example, a solution having a low ionic concentration and/or a low electrical resistivity. By way of example, the passivation liquid comprises deionized water or an apolar solvent. This configuration advantageously makes it possible to prevent or slow down corrosion or degradation of the electronic component as a result of electromechanical stresses in the presence of a, for example, moist or wet environment, heat and/or electrical voltage.

In one preferred configuration, the passivation liquid has an electrical resistivity of between 10 and 1000 kΩcm.

In one alternative configuration, the passivation liquid has an electrical resistivity of above 10 kΩcm.

In one preferred configuration, internal electrodes are arranged in the main body, wherein the internal electrodes are electrically isolated from one another. In this case, the internal electrodes can alternately adjoin two opposite end sides of the main body and/or be accessible from the end sides, for example, for making contact with external electrodes.

In a preferred configuration, the main body is provided with external electrodes, wherein the external electrodes are electrically isolated from one another and each external electrode is electrically conductively connected to a plurality of internal electrodes.

This advantageously enables an embodiment of the electronic component as a multilayer component and the utilization of the advantages associated therewith. The advantages concern, for example, in the case of piezoelectric components, a greater deflection during operation.

A method for passivating a main body comprising a porous material is furthermore specified. The electronic component described above or a main body of the component is preferably passivated by means of the method described here.

In particular, all features disclosed for the passivating method can also relate to the electronic component described above, and vice versa.

The passivating method comprises providing the main body. The method furthermore comprises exposing surface pores of the porous material of the main body to a passivation liquid, wherein the passivation liquid penetrates into the surface pores and remains there.

One advantage of the passivating method concerns the possibility of not requiring complex liquid phase and gas phase processes, to apply protective glass ceramics or metallic layers to the main body or the component in order to protect the latter against the penetration of corrosive substances.

Furthermore, it is possible to dispense with the complex production of high-density ceramics, wherein no or very few openly accessible surface pores or cracks arise.

The prevention of microcracks likewise significantly increases the lifetime of the electromechanically stressed electronic components.

The infiltration of the surface pores with the passivation liquid is furthermore cost-effective, as a result of which the electronic component can advantageously be produced with low costs.

Although the surface pores are expediently accessible from an environment of the main body, the passivation liquid advantageously remains in the surface pores since, on account of the geometry of the surface pores having diameters in the range of a few nanometers, for example, it evaporates only very slowly or not significantly or not measurably slowly.

The surface pores are exposed preferably by means of the main body being immersed in the passivation liquid. Alternatively, the surfaces can also be exposed to the passivation liquid by other methods, for example, by the surface of the main body being wetted with the passivation liquid.

In one preferred configuration of the method, the surface pores are exposed to the passivation liquid for the purpose of passivating the surface of the main body.

In one preferred configuration of the method, the surface pores are exposed to the passivation liquid under the conditions of the ambient pressure and/or without an external pressure being applied. The exposure of the surface pores to the passivation liquid can be a spontaneous infiltration of the pores with the passivation liquid. The exposure of the surface pores to the passivation liquid can be carried out under standard pressure conditions. As a result of this configuration, advantageously it is possible to dispense with further components enabling an infiltration, for example, under increased pressure, and the main body can accordingly be passivated particularly simply and cost-effectively.

In one alternative configuration of the method, the surface pores are exposed to the passivation liquid under increased external pressure. In accordance with this configuration, the surface pores can advantageously be infiltrated by the passivation liquid particularly simply.

In one preferred configuration of the method, the surface pores are exposed to the passivation liquid at room temperature. This configuration advantageously does not require a device for heating or heating up the main body during passivation. Moreover, thermally induced damage, for example, to the main body, can thus advantageously be prevented.

A method for producing the electronic component comprising the following steps is furthermore specified. The producing method comprises sintering a green element provided for the main body of the component, in order to form the main body, wherein the green element comprises a sintered, porous material. Furthermore, the producing method comprises providing the main body with one or a plurality of external electrodes. Furthermore, the producing method comprises passivating the porous main body provided with the external electrode in accordance with the passivating method described above. Furthermore, the producing method comprises electrolytically treating the main body provided with the external electrode or external electrodes. Furthermore, the producing method comprises completing the electronic component.

The electronic component described above or a main body of this component is preferably produced by means of the producing method described here.

In one preferred configuration of the passivating method, the main body is provided with the external electrode at temperatures of between 700° C. and 800° C.

In one preferred configuration, the electroplating of the main body is carried out in an electrolyte solution, for example, containing nickel and tin. The purpose of the electroplating can be a metallization of the main body that is in addition to or supports the provision of the main body with one or a plurality of external electrodes, a shielding, for example, against electric fields, or a contact-forming metallization.

The producing method can furthermore comprise a surface activation of the material of the external electrode, for example, by means of "fluxing". During "fluxing" a surface of the material of the external electrode can be treated and/or be activated with a flux, for example, alkaline solutions.

The producing method can furthermore comprise treating the main body, the electroplated main body and/or the external electrode(s) with, for example, alkali-containing soldering fluxes, such as sodium or potassium hydroxide solutions and/or grinding protection media.

In one preferred configuration the main body is dried in surface regions of the main body in which no pores are situated, for example, at 120° C. in a drying cabinet. In this case, the vapor pressure of the passivation liquid is preferably chosen such that the passivation liquid remains in the surface pores and does not evaporate during drying.

BRIEF DESCRIPTION OF THE DRAWINGS

Further advantages, advantageous configurations and expediencies of the invention will become apparent from the following description of the example embodiments in association with the figures.

FIG. 1 schematically shows a cross section through a main body for an electronic component.

FIG. 2 schematically shows a cross section through the electronic component.

Elements that are identical, of identical type and act identically are provided with identical references in the figures. The figures and the size relationships of the elements illustrated in the figures among one another should not be regarded as to scale. Rather, individual elements may be illustrated with exaggerated size in order to enable better illustration and/or in order to afford a better understanding.

DETAILED DESCRIPTION OF ILLUSTRATIVE EMBODIMENTS

FIG. 1 shows a schematic cross section through a main body 1. The main body 1 is preferably a ceramic. The main body has a surface 7. Three surface pores 2 of the main body 1 are illustrated by way of example. The surface pores 2 can be sintering pores that arose during a sintering of the material forming the main body. The size and the shape of the surface pores can accordingly vary statistically. The diameters D of the surface pores are preferably in the nanometer range.

A passivation liquid 3 is arranged in each of the surface pores 2. The main body 1 furthermore has surface regions 6 in which no pores are situated. The surface regions are free of the passivation liquid 3.

The passivation liquid can preferably be an inert solution or quasi-inert solution, for example, comprising deionized water or an apolar solvent.

The passivation liquid preferably prevents the penetration of corrosive substances, for example, nickel- and/or tin-comprising electrolyte solutions, alkali-containing soldering fluxes, such as sodium or potassium hydroxide solutions and/or grinding protection media, into the main body 1 via the surface pores 3, or makes this more difficult.

The corrosive substances can also be acidic or basic solutions employed during the production process.

Furthermore, the presence of the passivation liquid in the surface pores 3 preferably makes more difficult or slows down the reaction kinetics of the electromechanical reactions and/or the arising of microcracks in the main body 1. The passivation liquid 3 preferably passivates a surface 7 of the main body 1.

The passivation liquid 3 preferably penetrates into the surface pores 2 during exposure, in particular immersion of the main body 1 into the passivation liquid 3. The passivation liquid 3 can likewise pass into the surface pores 2 as a result of the main body 1 being wetted with the passivation liquid 3. As a result of the size of the surface pores and the choice of the vapor pressure of the passivation liquid 3, the passivation liquid 3 preferably remains within the surface pores, even for the case where the main body 1 was dried or washed after the exposure of the surface pores 2 to the passivation liquid 3.

The exposure preferably takes place by means of so-called spontaneous infiltration of the passivation liquid 3, wherein preferably no external pressure and no elevated temperatures are required.

Preferably, the penetration of the passivation liquid 3 into the surface pores 2 is carried out by means of spontaneous infiltration under ambient pressure conditions at room temperature.

FIG. 2 shows a schematic cross section through an electronic component 100. The electronic component 100 comprises the main body 1. Furthermore, the electronic component 100 comprises internal electrodes 5. The internal electrodes 5 are arranged within the main body 1. The internal electrodes 5 are furthermore arranged in an overlapping or intermeshing fashion. The electronic component 100 furthermore comprises external electrodes 4. An external electrode 4 is in each case arranged at an end side of the electronic component 100. The external electrodes 4 are electrically isolated from one another and electrically conductively connected to two exemplary internal electrodes 5 in each case.

The electronic component 100 is preferably a multilayer component, for example, a varistor, a piezoelectric component or a capacitor.

Production of the electronic component can preferably comprise the steps of sintering the material provided for the main body 1 to form the main body, providing the main body 1 with the external electrodes 4, passivating the main body 1 provided with the external electrodes 4, as described above, electroplating the main body 1 and completing the electronic component.

The main body is preferably electroplated in an electrolyte solution containing nickel or tin, for example.

The electronic component 100 can be, for example, a multilayer varistor of the 0506 design or a high-power piezo actuator in which the external electrodes were fired at 780° C. After providing the external electrode, it is possible for the electronic component to be dipped into deionized water at room temperature for infiltration with the passivation liquid and then to be dried at 120° C. in a drying cabinet.

The electronic component 100 can likewise be an EPC4 piezo actuator or a copper piezo actuator based on porous predetermined breaking locations in which the external electrodes were fired at 740° C. The electronic component can then be "hot polarized" and then be dipped into the passivation liquid 3 for infiltration and be dried at 120° C. In that case, a surface activation of the external electrodes can be carried out electrolytically by means of "fluxing" or hot-dip galvanizing and the electronic component 100 can then be washed in coloradol and water and dried.

One advantage over non-passivated electronic components in the present case is that residues of the corrosive substances which can already be present at the ppm level ("ppm" stands for "parts per million") in components not passivated according to the invention can lead to a degradation of the component by means of the arising of microcracks or damaging electrochemical reactions.

The passivation method presented advantageously makes it possible to dispense, in particular, with the cleaning of the main body, for example, during the production of the electronic component, at temperatures of far greater than 200° C. and with corresponding vacuum processes which result industrially in huge temporal and financial expenditure. Elevated temperatures can result in an appreciable impairment of the electrical properties of the electronic components. Specifically, soldered joints can be detached or thermal cracks can form. Furthermore, temperatures above the Curie temperature result in appreciable dielectric depolarization in the case of piezoelectric components.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. An electronic component comprising:
   a main body comprising a porous material having surface pores at a surface of the main body; and
   a passivation liquid dispensed in the surface pores,
   wherein surface regions of the main body in which no surface pores are located are free of the passivation liquid.

2. The electronic component according to claim 1, wherein the surface of the main body is passivated with the passivation liquid.

3. The electronic component according to claim 1, wherein the main body comprises a ceramic.

4. The electronic component according to claim 1, wherein the passivation liquid dispensed in the surface pores prevents or makes more difficult penetration of foreign substances into the main body via the surface pores.

5. The electronic component according to claim 4, wherein the foreign substances comprise Ni- and/or Sn-comprising electrolyte solutions, alkali-containing soldering fluxes, and/or a grinding protection media.

6. The electronic component according to claim 5, wherein the foreign substances further comprise Na or K hydroxide solutions.

7. The electronic component according to claim 1, wherein the passivation liquid is an inert solution or a quasi-inert solution.

8. The electronic component according to claim 1, wherein the passivation liquid comprises deionized water or an apolar solvent.

9. The electronic component according to claim 1, wherein the passivation liquid has an electrical resistivity of between 10 and 1000 kΩcm.

10. The electronic component according to claim 1, wherein internal electrodes are arranged in the main body, and wherein the internal electrodes are electrically isolated from one another.

11. The electronic component according to claim 10, wherein the main body is provided with external electrodes, and wherein the external electrodes are electrically isolated from one another and each external electrode is electrically conductively connected to a plurality of internal electrodes.

12. The electronic component according to claim 1, wherein the component is a multilayer component.

13. The electronic component according to claim 1, wherein the component is a varistor, a piezoelectric component or a capacitor.

14. The electronic component according to claim 1, wherein the passivation liquid is arranged permanently in the surface pores of the main body.

15. The electronic component according to claim 1, wherein the passivation liquid protects at least one of the surface pores and the main body against penetration of a media or substances that are corrosive or damaging to the main body.

16. A method for passivating a main body composed of a porous material, the method comprising:
providing the main body; and
exposing surface pores of the porous material of the main body to a passivation liquid,
wherein the passivation liquid penetrates into the surface pores and remains there, and
wherein surface regions of the main body in which no surface pores are located are free of the passivation liquid.

17. The method according to claim 16, wherein the surface pores are exposed to the passivation liquid without an external pressure being applied.

18. The method according to claim 16, wherein the surface pores are exposed to the passivation liquid at room temperature.

19. A method for producing an electronic component, the method comprising:
sintering a green element provided for a main body of the component, wherein the green element comprises a sintered, porous material;
forming an external electrode on the main body;
passivating the porous main body provided with the external electrode by exposing surface pores of the porous material of the main body to a passivation liquid, wherein the passivation liquid penetrates into the surface pores and remains there,
electrolytically treating the main body with the external electrode; and
performing additional steps to complete the electronic component,
wherein surface regions of the main body in which no surface pores are located are free of the passivation liquid.

20. The method according to claim 19, wherein electrolytically treating the main body provided with the external electrode is carried out in an electrolyte solution.

21. The method according to claim 20, wherein the electrolyte solution contains nickel and tin.

* * * * *